United States Patent
Kuno et al.

(10) Patent No.: US 12,500,071 B2
(45) Date of Patent: Dec. 16, 2025

(54) WAFER PLACEMENT TABLE

(71) Applicant: NGK Insulators, Ltd., Nagoya (JP)

(72) Inventors: Tatsuya Kuno, Nagoya (JP); Seiya Inoue, Handa (JP); Hiroshi Takebayashi, Handa (JP); Masaki Ishikawa, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 586 days.

(21) Appl. No.: 17/930,118

(22) Filed: Sep. 7, 2022

(65) Prior Publication Data
US 2023/0116574 A1    Apr. 13, 2023

(30) Foreign Application Priority Data

Oct. 8, 2021 (JP) ................................ 2021-166020
Jun. 28, 2022 (JP) ................................ 2022-103726

(51) Int. Cl.
*H01J 37/32* (2006.01)
*H01L 21/687* (2006.01)

(52) U.S. Cl.
CPC .. *H01J 37/32724* (2013.01); *H01L 21/68785* (2013.01); *H01J 2237/002* (2013.01); *H01J 2237/2005* (2013.01); *H01J 2237/2007* (2013.01)

(58) Field of Classification Search
CPC ....... H01J 2237/2007; H01J 2237/2005; H01J 2237/002; H01J 37/3274
See application file for complete search history.

(56) References Cited

U.S. PATENT DOCUMENTS

| | | | |
|---|---|---|---|
| 4,740,414 A * | 4/1988 | Shaheen | H05K 1/113 428/428 |
| 2008/0138645 A1 | 6/2008 | Kawajiri et al. | |
| 2014/0287245 A1* | 9/2014 | Jindo | H01L 21/67109 428/446 |
| 2015/0036261 A1 | 2/2015 | Jindo et al. | |

(Continued)

FOREIGN PATENT DOCUMENTS

| | | |
|---|---|---|
| CN | 101165871 A | 4/2008 |
| JP | H04-287344 A | 10/1992 |

(Continued)

OTHER PUBLICATIONS

Korean Office Action (Application No. 10-2022-0113417) dated Mar. 18, 2024 (with English translation) (11 pages).

(Continued)

*Primary Examiner* — Devon Lane
(74) *Attorney, Agent, or Firm* — BURR PATENT LAW, PLLC

(57) ABSTRACT

A wafer placement table is a wafer placement table that includes a refrigerant flow channel through which refrigerant is flowed and includes a top base including a ceramic base incorporating an electrode and having a wafer placement surface on a top surface of the ceramic base, a bottom base on a top surface of which a flow channel groove defining a side wall and a bottom of the refrigerant flow channel is provided, and a seal member disposed between the top base and the bottom base so as to seal the refrigerant flow channel from an outside.

14 Claims, 12 Drawing Sheets

(56) References Cited

U.S. PATENT DOCUMENTS

| | | | | |
|---|---|---|---|---|
| 2015/0077895 A1* | 3/2015 | Jindo | ................... | C04B 35/645 228/121 |
| 2016/0276198 A1* | 9/2016 | Anada | ................ | H01L 21/6831 |
| 2019/0343019 A1* | 11/2019 | Todorovic | .......... | H05K 7/20927 |

FOREIGN PATENT DOCUMENTS

| | | | |
|---|---|---|---|
| JP | 2001-110883 | A | 4/2001 |
| JP | 2003-077996 | A | 3/2003 |
| JP | 2005-276886 | A | 10/2005 |
| JP | 2007-059580 | A | 3/2007 |
| JP | 2008-066707 | A | 3/2008 |
| JP | 2012-142413 | A | 7/2012 |
| JP | 5666748 | B1 | 2/2015 |
| JP | 5666749 | B1 | 2/2015 |
| JP | 2017-126640 | A | 7/2017 |
| JP | 2017126641 | A * | 7/2017 |
| JP | 2021-057544 | A | 4/2021 |
| KR | 10-2014-0137016 | A | 12/2014 |
| TW | I518841 | B | 1/2016 |

OTHER PUBLICATIONS

Japanese Office Action (with English translation) dated Nov. 19, 2024 (Application No. 2022-103726).

Taiwanese Office Action (Application No. 111136919) dated Oct. 20, 2023 (5 pages).

Chinese Office Action dated Oct. 19, 2024 (Application No. 202211052075.5).

Chinese Office Action (with English translation) dated Mar. 7, 2025 (Application No. 202211052075.5).

* cited by examiner

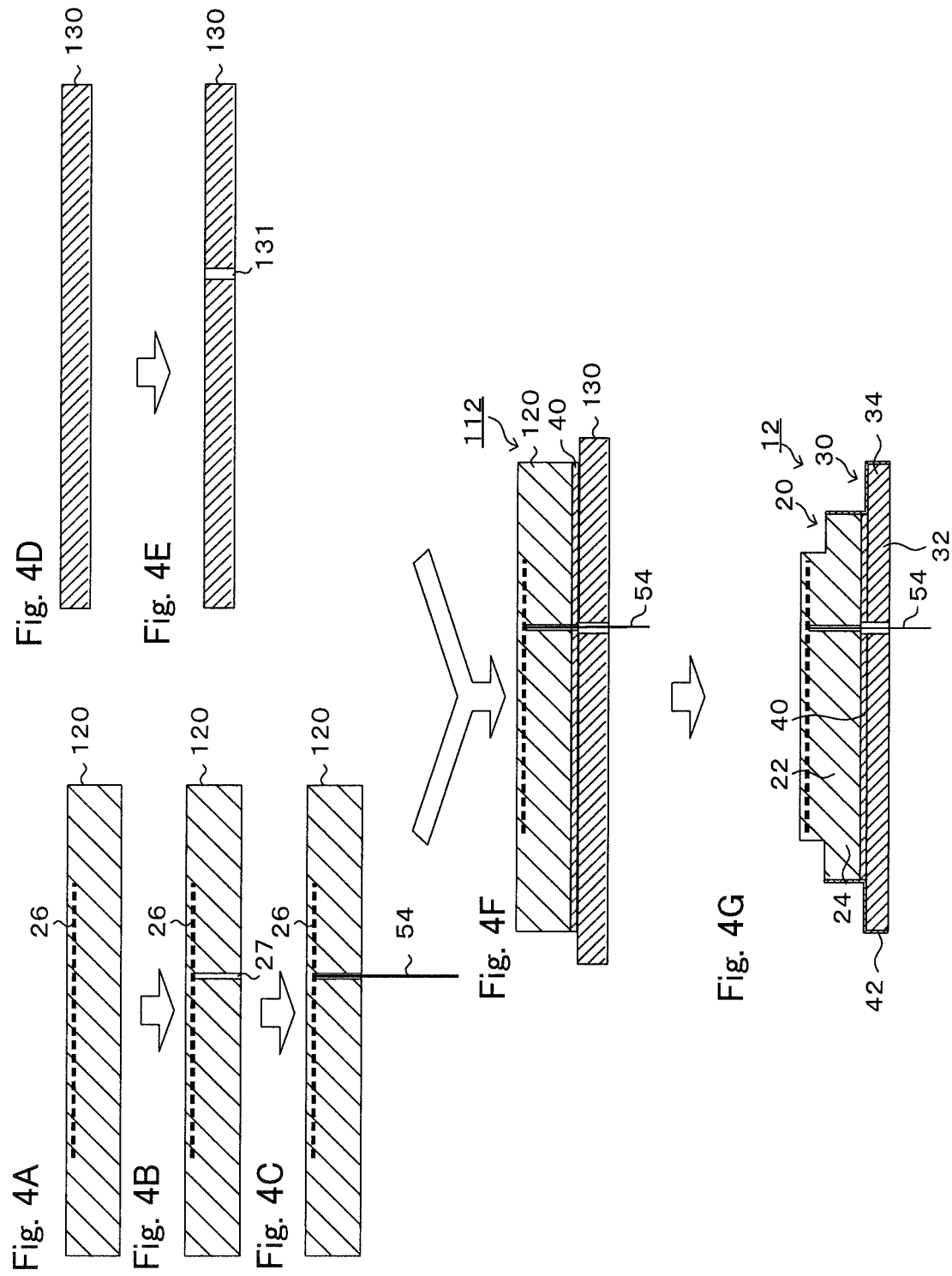

WAFER PLACEMENT TABLE

BACKGROUND OF THE INVENTION

1. Field of the Invention

The present invention relates to a wafer placement table.

2. Description of the Related Art

Hitherto, there is known a wafer placement table in which a ceramic base made of alumina or the like in which an electrostatic electrode is embedded and a cooling base made of metal, such as aluminum, are bonded to each other via a resin layer (see, for example, Patent Literature 1). With such a wafer placement table, the influence of a difference in coefficient of thermal expansion between a ceramic base and a cooling base can be reduced by a resin layer. There is also known a wafer placement table in which a ceramic base and a cooling base having a refrigerant flow channel are bonded to each other by using a metal bonding layer instead of a resin layer (see, for example, Patent Literatures 2 and 3). Since a metal bonding layer is higher in thermal conductivity than a resin layer, it is possible to achieve heat dissipation performance required in the case where a wafer is processed with high-power plasma. On the other hand, since a metal bonding layer is higher in Young's modulus and lower in stress relaxation properties than a resin layer, the influence of a difference in thermal expansion between a ceramic base and a cooling base almost cannot be reduced. Therefore, in Patent Literatures 2 and 3, a metal matrix composite material (MMC) with a small difference in coefficient of thermal expansion from a ceramic base is used as the material of a cooling base.

CITATION LIST

Patent Literature

PTL 1: JP H4-287344 A
PTL 2: JP 5666748 B
PTL 3: JP 5666749 B

SUMMARY OF THE INVENTION

However, when a cooling base in which a refrigerant flow channel is provided is used, there is a possibility that a part above the refrigerant flow channel thermally expands as a result of large heat input due to high-power plasma and, due to a difference in thermal expansion or the like, a wafer placement table breaks from around a boundary between a ceiling surface and side wall surface of the refrigerant flow channel.

The present invention is made to solve such an inconvenience, and it is a main object to prevent a breakage due to thermal stress in a wafer placement table in which a refrigerant flow channel is provided.

[1] A wafer placement table of the present invention is a wafer placement table that includes a refrigerant flow channel through which refrigerant is flowed, and includes: a top base that includes a ceramic base incorporating an electrode and having a wafer placement surface on a top surface of the ceramic base; a bottom base on a top surface of which a flow channel groove that defines a side wall and a bottom of the refrigerant flow channel is provided; and a seal member disposed between the top base and the bottom base so as to seal the refrigerant flow channel from an outside.

With this wafer placement table, the top base that defines the ceiling surface of the refrigerant flow channel and the bottom base that defines the side wall surface of the refrigerant flow channel are not united and the seal member is disposed therebetween. Therefore, even when a difference in thermal expansion occurs between the ceiling surface and the side wall surface of the refrigerant flow channel, the seal member absorbs the influence of the difference in thermal expansion. Hence, in the wafer placement table that includes the refrigerant flow channel, it is possible to prevent a breakage of the wafer placement table due to thermal stress.

In the specification, up and down, right and left, front and rear, and the like can be used for describing the present invention; however, up and down, right and left, and front and rear are only relative positional relationships. Therefore, when the orientation of the wafer placement table is changed, up and down can be right and left or right and left can be up and down. The technical scope of the present invention also encompasses such a case.

[2] In the above-described wafer placement table (the wafer placement table described in [1]), the top base may include the ceramic base, a ceiling base bonded to a bottom surface of the ceramic base and defining a ceiling of the refrigerant flow channel, and a metal bonding layer bonding the ceramic base with the ceiling base.

[3] In the above-described wafer placement table (the wafer placement table described in [2]), the absolute value of a difference in coefficient of linear thermal expansion from 40° C. to 400° C. between the ceiling base and the ceramic base may be less than or equal to $1.5 \times 10^{-6}$/K. With this configuration, since a difference in thermal expansion between the ceramic base and the ceiling base is small, a warpage or breakage of the top base due to thermal stress is reduced. In the specification, the coefficient of linear thermal expansion obtained by measuring the length at 40° C. and the length at 400° C. is referred to as the coefficient of linear thermal expansion from 40° C. to 400° C.

[4] In the above-described wafer placement table (the wafer placement table described in [2] or [3]), the ceiling base may be made of a composite material of metal and ceramics. Since the absolute value of a difference in coefficient of linear thermal expansion between a composite material of metal and ceramics and the ceramic base is small, thermal stress is less likely to occur in the top base. Since a composite material of metal and ceramics is higher in ductility than a ceramic material, the top base is less likely to break even when there occurs thermal stress.

[5] In the above-described wafer placement table (the wafer placement table described in [2] or [3]), the ceiling base may be made of a ceramic material of which a main component is the same as a main component of the ceramic base. Since the absolute value of a difference in coefficient of linear thermal expansion between ceramic materials having the same main component is small, thermal stress is less likely to occur in the top base. In the specification, the main component is a component that occupies 50 percent by mass or higher of the entire component contained, preferably 70 percent by mass or higher, and more preferably 90 percent by mass or higher.

[6] In the above-described wafer placement table (the wafer placement table described in [1]), the top base may be made of a single layer of the ceramic base.

[7] In the above-described wafer placement table (the wafer placement table described in any one of [1] to [6]), the bottom base may be made of an easy-to-work material. It is easy to form a flow channel groove from an easy-to-work material, so a working cost is reduced.

[8] In the above-described wafer placement table (the wafer placement table described in any one of [1] to [7]), multiple outer seal members provided so as to surround an outermost edge of the flow channel groove may be provided as the seal member. With this configuration, since the flow channel groove-side outer seal member is protected from process gas or plasma by the outermost peripheral outer seal member, corrosion resistance is increased.

[9] The above-described wafer placement table (the wafer placement table described in any one of [1] to [8]) may further include a heatsink sheet disposed between the bottom surface of the top base and a top surface of the bottom base. With this configuration, heat of the top base is easily quickly transferred to the bottom base by the heatsink sheet. As a result, the efficiency of cooling a wafer increases.

[10] In the above-described wafer placement table (the wafer placement table described in [9]), a thermal resistance of the heatsink sheet may be lower than or equal to 0.5K·cm²/W. With this configuration, heat of the top base is quickly transferred to the bottom base, so the efficiency of cooling a wafer increases.

[11] In the above-described wafer placement table (the wafer placement table described in [9] or [10]), a Young's modulus of the heatsink sheet may be lower than or equal to 100 MPa. With this configuration, the heatsink sheet is firmly in close contact with the top base and the bottom base, so heat of the top base is further quickly transferred to the bottom base, and the efficiency of cooling a wafer further increases.

[12] In the above-described wafer placement table (the wafer placement table described in any one of [9] to [11]), the heatsink sheet may have a body part disposed on a part, where the flow channel groove is not provided, on a top surface of the bottom base, and a bridge part bridged over the flow channel groove. The body part quickly transfers heat of the top base to the bottom base. The bridge part holds the sheet shape of the heatsink sheet to increase the handling of the heatsink sheet. Therefore, with the wafer placement table that includes the body part and the bridge part, it is possible to increase the efficiency of cooling a wafer and workability at the time of assembling the wafer placement table.

[13] In the above-described wafer placement table (the wafer placement table described in any one of [1] to [12]), the top base and the bottom base may be mechanically bonded such that the seal member gets squished from both top and bottom. Since the seal member is sufficiently squished from both top and bottom in mechanical bonding, it is possible to sufficiently exercise the seal function of the seal member. With the mechanical bonding, the heatsink sheet is firmly in close contact with the top base and the bottom base, so heat of the top base is further quickly transferred to the bottom base, and the efficiency of cooling a wafer further increases.

[14] The above-described wafer placement table (the wafer placement table described in any one of [1] to [13]) may include a through-hole extending through the bottom base in an up and down direction, a threaded hole provided at a location facing the through-hole on the bottom surface of the top base, and a screw member inserted into the through-hole from a bottom surface of the bottom base and screwed to the threaded hole. With this wafer placement table, the top base and the bottom base are mechanically bonded by the screw member.

BRIEF DESCRIPTION OF THE DRAWINGS

FIGS. 4A to 4G are manufacturing process charts of the wafer placement table 10 (a manufacturing process for a top base 12).

DETAILED DESCRIPTION OF THE INVENTION

Figure 1:
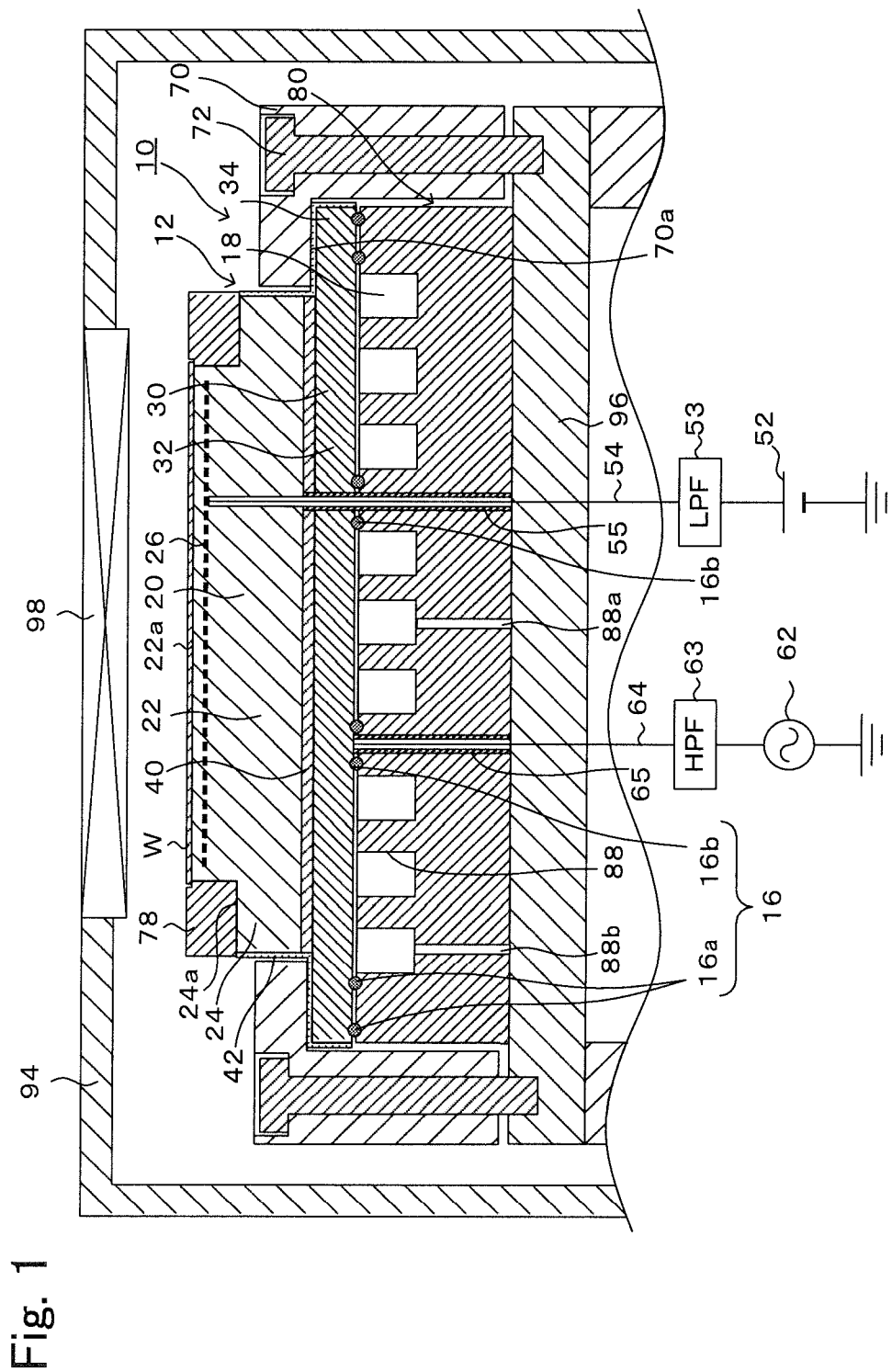
FIG. 1 is a longitudinal sectional view of a wafer placement table 10 placed in a chamber 94.
Figure 2:
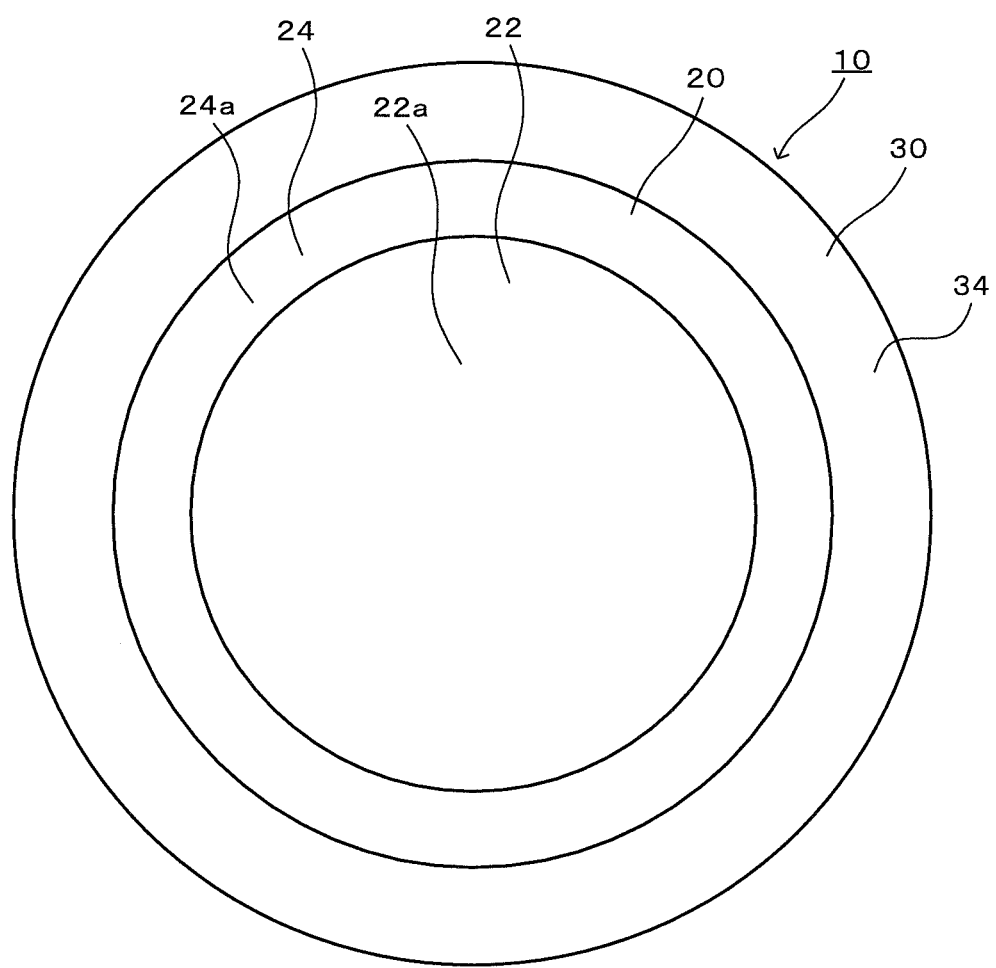
FIG. 2 is a plan view of the wafer placement table 10.
Figure 3:
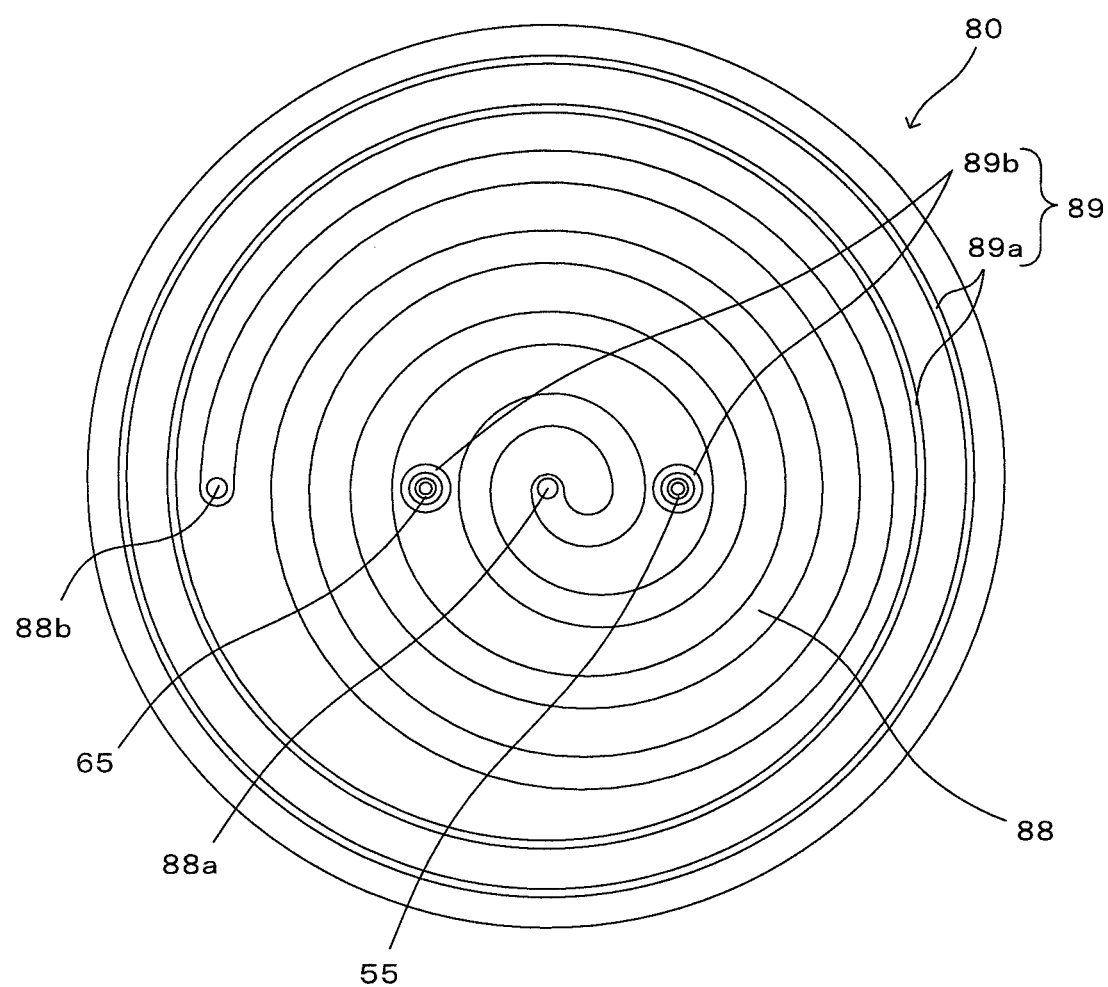
FIG. 3 is a plan view of a bottom base 80.

A preferred embodiment of the present invention will be described below with reference to the drawings. FIG. 1 is a longitudinal sectional view of a wafer placement table 10 (a sectional view taken along a plane including the central axis of the wafer placement table 10) placed in a chamber 94, FIG. 2 is a plan view of the wafer placement table 10, and FIG. 3 is a plan view of a bottom base 80. In the specification, "X to Y" indicating a numeric range is used as a meaning of including numeric values X and Y as a lower limit value and an upper limit value.

The wafer placement table 10 is used to perform CVD, etching, or the like on a wafer W by using plasma, and is fixed to a mounting plate 96 provided inside the semiconductor process chamber 94. The wafer placement table 10 includes a top base 12, the bottom base 80, and seal members 16. The wafer placement table 10 has a refrigerant flow channel 18 in which refrigerant is able to circulate. The refrigerant flow channel 18 is a region between the bottom surface of the top base 12 and the top surface of the bottom base 80 on the inner side of outer seal members 16a and on the outer side of inner seal members 16b. There is a gap between the bottom surface of the top base 12 and the top surface of the bottom base 80, and refrigerant is able to flow through the gap in the refrigerant flow channel 18.

The top base 12 includes a ceramic base 20, a ceiling base 30 disposed on the lower side of the ceramic base 20 and defining the ceiling of the refrigerant flow channel 18, and a metal bonding layer 40 bonding the ceramic base 20 with the ceiling base 30. The thickness of the top base 12 is preferably greater than or equal to 8 mm or greater than or equal to 10 mm when the strength is taken into consideration and is preferably less than or equal to 25 mm when the cooling efficiency is taken into consideration.

The ceramic base 20 includes an outer peripheral part 24 having an annular focus ring placement surface 24a, on the outer peripheral side of a central part 22 having a circular wafer placement surface 22a. Hereinafter, a focus ring may be abbreviated as "FR". A wafer W is placed on the wafer placement surface 22a, and a focus ring 78 is placed on the FR placement surface 24a. The ceramic base 20 is made of a ceramic material, typically, alumina, aluminum nitride, or the like. The FR placement surface 24a is lower in level than the wafer placement surface 22a.

The central part 22 of the ceramic base 20 incorporates a wafer attraction electrode 26 on the side close to the wafer placement surface 22a. The wafer attraction electrode 26 is made of a material that contains, for example, W, Mo, WC, MoC, or the like. The wafer attraction electrode 26 is a disc-shaped or mesh-shaped single-pole electrostatic electrode. A layer of the ceramic base 20 on the upper side of the wafer attraction electrode 26 functions as a dielectric layer. A wafer attraction direct current power supply 52 is connected to the wafer attraction electrode 26 via a power supply terminal 54. The power supply terminal 54 is provided so as to pass through an electrically insulating tube 55 disposed in a through-hole extending through the bottom base 80, the ceiling base 30, and the metal bonding layer 40 in the up and down direction and reach the wafer attraction electrode 26 from the bottom surface of the ceramic base 20. A low pass filter (LPF) 53 is provided between the wafer attraction direct current power supply 52 and the wafer attraction electrode 26.

The ceiling base 30 is a disk member made of a composite material of metal and ceramics (hereinafter, also referred to as metal-ceramic composite material). Examples of the metal-ceramic composite material include a metal matrix composite material (metal matrix composite (MMC)) and a ceramic matrix composite material (ceramic matrix composite (CMC)). The outside diameter of the ceiling base 30 is greater than the outside diameter of the ceramic base 20. The ceiling base 30 has an inner peripheral part 32 on which the ceramic base 20 is disposed and an outer peripheral part 34 projecting from the outer periphery of the ceramic base 20. The top base 12 is clamped to the mounting plate 96 together with the bottom base 80 at the outer peripheral side (outer peripheral part 34) of the ceiling base 30. The absolute value of a difference in coefficient of linear thermal expansion from 40° C. to 400° C. between a metal-ceramic composite material used for the ceiling base 30 and the ceramic material used for the ceramic base 20 is preferably less than or equal to $1.5 \times 10^{-6}$/K, more preferably less than or equal to $1.0 \times 10^{-6}$/K, and further preferably less than or equal to $0.5 \times 10^{-6}$/K. Specific examples of such metal-ceramic composite materials include a material including Si, SiC, and Ti, and a material obtained by impregnating an SiC porous body with Al and/or Si. The material including Si, SiC, and Ti is referred to as SiSiCTi, the material that impregnates an SiC porous body with Al is referred to as AlSiC, and the material that impregnates an SiC porous body with Si is referred to as SiSiC. When the ceramic base 20 is an alumina base, the metal-ceramic composite material used for the ceiling base 30 is preferably AlSiC, SiSiCTi, or the like. The coefficient of linear thermal expansion from 40° C. to 400° C. is $7.2 \times 10^{-6}$/K for alumina, $7.8 \times 10^{-6}$/K for AlSiC (SiC 75%), and $7.3 \times 10^{-6}$/K for SiSiCTi. When the ceramic base 20 is an aluminum nitride base, the metal-ceramic composite material used for the ceiling base 30 is preferably AlSiC, SiSiC, or the like. The coefficient of linear thermal expansion from 40° C. to 400° C. is $4.6 \times 10^{-6}$/K for aluminum nitride, and $5.6 \times 10^{-6}$/K for AlSiC (SiC 85%). The thermal conductivity of a material used for the ceiling base 30 is preferably higher than or equal to, for example, 50 W/(m·K), more preferably higher than or equal to 70 W/(m·K), and further preferably higher than or equal to 80 W/(m·K). The ceiling base 30 also functions as a radio-frequency (RF) electrode for generating plasma and is connected to an RF power supply 62 via a power supply terminal 64. The power supply terminal 64 is provided so as to pass through an electrically insulating tube 65 disposed in a through-hole extending through the bottom base 80 in the up and down direction and reach the bottom surface of the ceiling base 30. The power supply terminal 64 is provided in the chamber 94 and is urged by a spring (not shown) from the lower side toward the upper side. Therefore, the top end of the power supply terminal 64 is elastically in contact with the bottom surface of the ceiling base 30. A high pass filter (HPF) 63 is disposed between the ceiling base 30 and the RF power supply 62. The thickness of the ceiling base 30 is preferably greater than or equal to 3 mm or greater than or equal to 6 mm when the strength is taken into consideration and is preferably less than or equal to 20 mm when the cooling efficiency is taken into consideration.

The metal bonding layer 40 bonds the bottom surface of the ceramic base 20 with the top surface of the ceiling base 30. The metal bonding layer 40 may be, for example, a layer made of solder or a brazing metal material. The metal bonding layer 40 is formed by, for example, TCB (thermal compression bonding). TCB is a known method of sandwiching a metal bonding material between two members to be bonded and bonding the two members in a state of being heated to a temperature lower than or equal to a solidus temperature of the metal bonding material.

The side surface of the outer peripheral part 24 of the ceramic base 20, the outer periphery of the metal bonding layer 40, and the top surface and side surface of the ceiling base 30 are coated with an electrically insulating film 42. Examples of the electrically insulating film 42 include a sprayed film made of alumina, yttria, or the like.

The bottom base 80 is a disk member made of an easy-to-work material. The outside diameter of the bottom base 80 is the same as the outside diameter of the ceiling base 30. As shown in FIG. 3, a flow channel groove 88 and seal grooves 89 are provided on the top surface of the bottom base 80. The flow channel groove 88 defines the side wall and the bottom of the refrigerant flow channel 18 and is spirally provided from an inlet 88a to an outlet 88b so as to expand over the entire area in which the ceramic base 20 is disposed. The inlet 88a and the outlet 88b of the flow channel groove 88 extend through the bottom base 80 in the up and down direction and open at the bottom surface of the flow channel groove 88. The inlet 88a and the outlet 88b of the flow channel groove 88 are connected to a refrigerant cooling device (not shown), and refrigerant discharged from the outlet 88b is adjusted in temperature in the refrigerant cooling device, then returned to the inlet 88a again, and supplied into the flow channel groove 88 (refrigerant flow channel 18). Refrigerant flowing through the refrigerant flow channel 18 is preferably liquid and preferably has electrical insulating properties. Examples of the liquid having electrical insulating properties include fluoroinert fluid. The seal grooves 89 are grooves in which the seal members 16 are disposed, and, of the seal grooves 89, outer grooves 89a are provided so as to doubly surround the outermost edge of the flow channel groove 88, and inner grooves 89b are provided so as to respectively surround the electrically insulating tubes 55, 65. An easy-to-work material used for the bottom base 80 is preferably the one that is easier to work than the ceiling base 30 made of a metal-ceramic composite material. For example, a machinability index described in JIS B 0170 (2020) may be used as the index of workability. An easy-to-work material is preferably a material higher than or equal to 40 in machinability index, more preferably a material higher than or equal to 100 in machinability index, and further preferably higher than or equal to 140 in machinability index. Examples of the easy-to-work material include aluminum, aluminum alloy, stainless steel (SUS material), and resin (high-temperature resin). A material used for the bottom base 80 is preferably the one having a high thermal conductivity from the viewpoint of increasing the efficiency of cooling a wafer W. The thermal conductivity of a material used for the bottom base 80 is preferably higher than or equal to, for example, 80 W/(m·K), more preferably higher than or equal to 100 W/(m·K), and further preferably higher than or equal to 150 W/(m·K).

The seal members 16 are members that are disposed between the top base 12 and the bottom base 80 and that seal the refrigerant flow channel 18 from an outside. The seal members 16 are elastically deformable annular members. When the seal members 16 are squished in the up and down direction, the seal members 16 seal the refrigerant flow channel 18 from the outside and prevents leakage of refrigerant in the refrigerant flow channel 18 to the outside. Of the seal members 16, the outer seal members 16a are provided so as to doubly surround the outermost edge of the flow channel groove 88, and the inner seal members 16b are respectively provided so as to surround the electrically insulating tubes 55, 65. The outer seal members 16a prevent leakage of refrigerant in the refrigerant flow channel 18 from the outer periphery of the wafer placement table 10. The inner seal members 16b prevent leakage of refrigerant in the refrigerant flow channel 18 to around the electrically insulating tubes 55, 65. An O-ring, a gasket, or the like may be used as the seal member 16. The seal members 16 may be made of an electrically insulating material or may be made of an electrically conductive material. The seal members 16 may be made of resin or rubber or may be made of metal. The outer seal members 16a are respectively disposed in the outer grooves 89a, the inner seal members 16b are respectively disposed in the inner grooves 89b, and the outer seal members 16a and the inner seal members 16b are positioned.

The thus configured wafer placement table 10 is attached to the mounting plate 96 inside the chamber 94 by using a clamp member 70 in a state where the bottom base 80, the seal members 16, and the top base 12 are stacked in this order from the bottom. Thus, the top base 12 and the bottom base 80 of the wafer placement table 10 are mechanically bonded by clamping, the seal members 16 are squished in the up and down direction, and the refrigerant flow channel 18 is sealed from the outside. The clamp member 70 is an annular member with a substantially inverted L-shaped cross section and has an inner peripheral step surface 70a. The wafer placement table 10 and the mounting plate 96 are united by the clamp member 70. Specifically, in a state where the inner peripheral step surface 70a of the clamp member 70 is placed on the outer peripheral part 34 of the top base 12 (ceiling base 30) of the wafer placement table 10, bolts 72 are inserted from the top surface of the clamp member 70 and screwed to threaded holes provided on the top surface of the mounting plate 96. Thus, the wafer placement table 10 and the mounting plate 96 are united. The bolts 72 are mounted at multiple locations (for example, eight locations or 12 locations) provided at equal intervals along the circumferential direction of the clamp member 70. The clamp member 70 and the bolts 72 may be made of an electrically insulating material or may be made of an electrically conductive material (metal or the like). The clamp member 70 is preferably disposed with a play between the inner peripheral surface of the clamp member 70 and the outer peripheral surface of at least one of the top base 12 and the bottom base 80 so as to allow relative movement in a horizontal direction between the top base 12 and the bottom base 80.

Figure 5A:
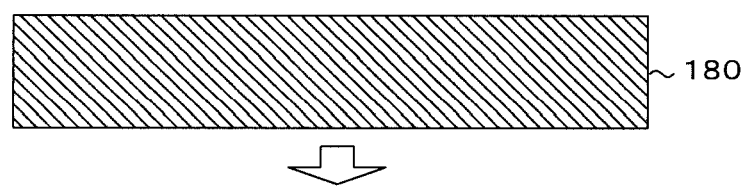
FIGS. 5A and 5B are manufacturing process charts of the wafer placement table 10 (a manufacturing process for the bottom base 80).
Figure 5B:
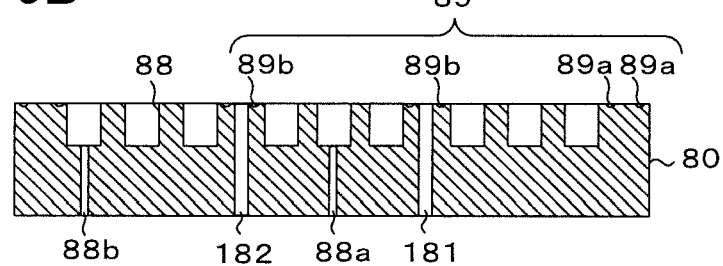
Figure 6A:
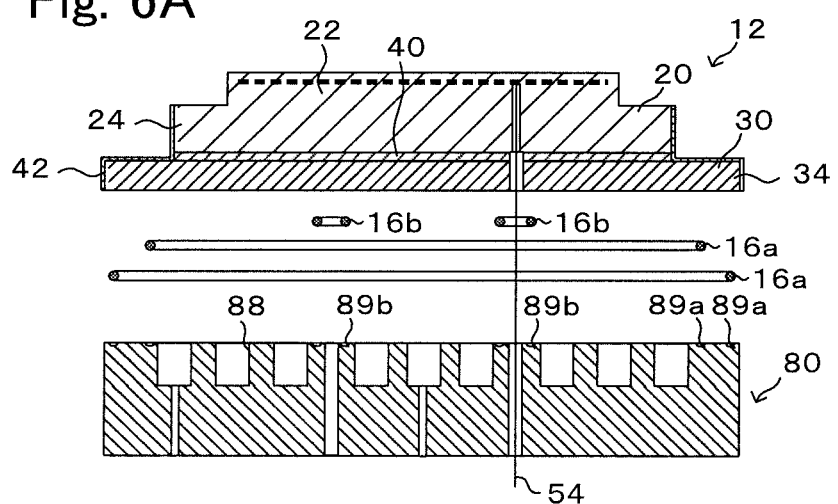
FIGS. 6A and 6B are manufacturing process charts of the wafer placement table 10 (an assembling process for the wafer placement table 10).
Figure 6B:
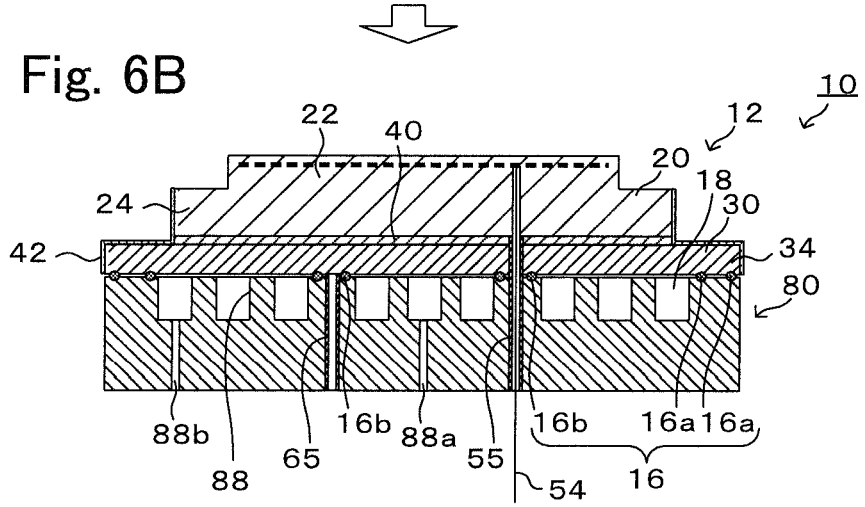

Next, an example of manufacturing of the wafer placement table 10 will be described with reference to FIGS. 4 to 6. FIGS. 4 to 6 are manufacturing process charts of the wafer placement table 10. FIGS. 4A to 4G show manufacturing processes for the top base 12. FIGS. 5A and 5B show manufacturing processes for the bottom base 80. FIGS. 6A and 6B show assembling processes for the wafer placement table 10.

The top base 12 is made, for example, as follows. Initially, a disk-shaped ceramic sintered body 120 that is the source of the ceramic base 20 is made by firing a ceramic powder mold by hot pressing (FIG. 4A). The ceramic sintered body 120 incorporates the wafer attraction electrode 26. Subsequently, a hole 27 is perforated from the bottom surface of the ceramic sintered body 120 to the wafer attraction electrode 26 (FIG. 4B), the power supply terminal 54 is inserted into the hole 27 and bonded to the wafer attraction electrode 26 (FIG. 4C).

In parallel with this, a disk member 130 made of a metal-ceramic composite material is made (FIG. 4D), and a through-hole 131 that extends through the disk member 130 in the up and down direction is formed (FIG. 4E). When the ceramic sintered body 120 is made of alumina, the disk member 130 is preferably made of SiSiCTi or AlSiC. This is because the coefficient of thermal expansion of alumina and the coefficient of thermal expansion of SiSiCTi or AlSiC are almost the same.

The disk member made of SiSiCTi can be made by, for example, as follows. Initially, a powder mixture is made by mixing silicon carbide, metal Si and metal Ti. After that, a disk-shaped mold is made by uniaxial pressing of the obtained powder mixture, and the mold is sintered by hot pressing in an inert atmosphere, with the result that the disk member made of SiSiCTi is obtained.

Subsequently, a metal bonding material is disposed on the top surface of the disk member 130 made of a metal-ceramic composite material. A through-hole that communicates with the through-hole 131 is provided in the metal bonding material in advance. Furthermore, the power supply terminal 54 of the ceramic sintered body 120 is inserted into the through-hole 131 of the disk member 130 and the ceramic sintered body 120 is placed on the metal bonding material disposed on the top surface of the disk member 130. Thus, a laminated body in which the disk member 130, the metal bonding material, and the ceramic sintered body 120 are laminated in this order from the bottom is obtained. By pressurizing the laminated body while heating the laminated body (TCB), a bonded body 112 is obtained (FIG. 4F). The bonded body 112 is configured such that the ceramic sintered body 120 is bonded via the metal bonding layer 40 to the top surface of the disk member 130 that is the source of the ceiling base 30.

TCB is performed, for example, as follows. In other words, the laminated body is pressurized at a temperature lower than or equal to a solidus temperature of the metal bonding material (for example, higher than or equal to a temperature obtained by subtracting 20° C. from the solidus temperature and lower than or equal to the solidus temperature) to perform bonding, after that the temperature is returned to a room temperature. Thus, the metal bonding material becomes the metal bonding layer (or an electrically conductive bonding layer). An Al—Mg bonding material or an Al—Si—Mg bonding material may be used as the metal bonding material at this time. When, for example, TCB is performed by using an Al—Si—Mg bonding material, the laminated body is pressurized in a state of being heated under vacuum atmosphere. The metal bonding material with a thickness of about 100 µm is preferable.

Subsequently, the ceramic base 20 with the central part 22 and the outer peripheral part 24 is obtained by cutting the outer periphery of the ceramic sintered body 120 to form a step. The ceiling base 30 is obtained by cutting as needed the outer periphery of the disk member 130. At this time, the outer peripheral part 34 of the ceiling base 30 projects from the outer periphery of the ceramic base 20. The side surface of the outer peripheral part 24 of the ceramic base 20, the periphery of the metal bonding layer 40, and the top surface and the side surface of the ceiling base 30 are subjected to thermal spraying by using ceramic powder to form the electrically insulating film 42 (FIG. 4G). Thus, the top base 12 is obtained.

The bottom base 80 is made, for example, as follows. Initially, an easy-to-work disk member 180 made of an easy-to-work material with a disk shape, which is the source of the bottom base 80, is prepared (FIG. 5A). The easy-to-work disk member 180 is preferably made of aluminum, aluminum alloy, stainless steel, or resin. Subsequently, the flow channel groove 88 and the seal grooves 89 (two outer grooves 89*a* and two inner grooves 89*b*) are formed on the top surface of the easy-to-work disk member 180, and the inlet 88*a* and the outlet 88*b* that extend from the bottom surface of the easy-to-work disk member 180 to the bottom surface of the flow channel groove 88 in the up and down direction are formed. Through-holes 181, 182 that extend through the easy-to-work disk member 180 in the up and down direction are formed (FIG. 5B). Thus, the bottom base 80 is obtained.

The wafer placement table 10 is assembled, for example, as follows by using the top base 12 and the bottom base 80 made as described above, and the seal members 16. Initially, the outer seal members 16*a* are disposed in the outer grooves 89*a* of the bottom base 80, and the inner seal members 16*b* are disposed in the inner grooves 89*b*. Subsequently, the power supply terminal 54 of the top base 12 is inserted in the through-holes 181, and the top base 12 is placed on the seal members 16 disposed on the top surface of the bottom base 80 (FIG. 6A). Then, the electrically insulating tube 55 that allows insertion of the power supply terminal 54 is disposed in the through-holes 131, 181, and the electrically insulating tube 65 that allows insertion of the power supply terminal 64 is disposed in the through-hole 182 (FIG. 6B). Thus, the wafer placement table 10 in which the bottom base 80, the seal members 16, and the top base 12 are stacked in this order from the bottom is obtained. In the obtained wafer placement table 10, the top base 12 and the bottom base 80 are clamped and used such that the seal members 16 are squished from both top and bottom.

Next, an example of the use of the wafer placement table 10 will be described with reference to FIG. 1. The wafer placement table 10 is fixed to the mounting plate 96 in the chamber 94 by the clamp member 70 as described above. A shower head 98 that discharges process gas from a large number of gas injection holes into the chamber 94 is disposed on the ceiling surface of the chamber 94.

A focus ring 78 is placed on the FR placement surface 24*a* of the wafer placement table 10, and a disk-shaped wafer W is placed on the wafer placement surface 22*a*. The focus ring 78 has a step along the inner periphery of an upper end part so as not to interfere with the wafer W. In this state, the wafer W is attracted to the wafer placement surface 22*a* by applying a direct current voltage of the wafer attraction direct current power supply 52 to the wafer attraction electrode 26. Then, the inside of the chamber 94 is set to a predetermined vacuum atmosphere (or decompression atmosphere), and an RF voltage from the RF power supply 62 is applied to the ceiling base 30 while process gas is being supplied from the shower head 98. As a result, plasma is generated between the wafer W and the shower head 98. Then, the wafer W is subjected to CVD deposition or etching by using the plasma. As the wafer W is subjected to a plasma process, the focus ring 78 abrades; however, the focus ring 78 is thicker than the wafer W, replacement of the focus ring 78 is performed after processing a plurality of wafers W.

In the above-described wafer placement table 10, not a cooling base that includes a refrigerant flow channel inside is used but the refrigerant flow channel 18 is formed by the bottom surface of the top base 12, the top surface of the bottom base 80 on the top surface of which the flow channel groove 88 is provided, and the seal members 16 disposed therebetween. With this wafer placement table 10, the top base 12 that defines the ceiling surface of the refrigerant flow channel 18 and the bottom base 80 that defines the side wall surface of the refrigerant flow channel 18 are not united and the seal members 16 are disposed therebetween. Therefore, even when a difference in thermal expansion occurs between the ceiling surface and the side wall surface of the refrigerant flow channel 18, the seal members 16 absorb the influence. Hence, in the wafer placement table that includes the refrigerant flow channel, it is possible to prevent a breakage of the wafer placement table due to thermal stress. The seal members 16 relax the influence of a difference in thermal expansion that can occur between the ceiling surface and side wall surface of the refrigerant flow channel 18, so it is not necessary to match the coefficient of thermal expansion between the ceiling base 30 that defines the ceiling surface and the bottom base 80 that defines the side wall surface, with the result that the flexibility of selection of the material of the ceiling base 30 and the bottom base 80 is high.

Since the ceiling base 30 made of a metal-ceramic composite material higher in ductility than a ceramic material is disposed at a bottom surface-side part where thermal stress easily occurs in the top base 12, a breakage is less likely to occur even when there occurs thermal stress. Since the ceramic base 20 and the ceiling base 30 are bonded by the metal bonding layer 40, heat dissipation performance is higher as compared to those bonded by a resin layer. Since the ceiling base 30 is made of a metal-ceramic composite material and the absolute value of a difference in the coefficient of linear thermal expansion between the ceiling base 30 and the ceramic base 20 is small, thermal stress is less likely to occur in the top base 12, so a warpage or breakage of the top base 12 due to thermal stress is less likely to occur. Furthermore, since a metal-ceramic composite material has conductivity, the ceiling base 30 is able to be used as an RF electrode, so another RF electrode does not need to be prepared. Here, the absolute value of a difference in coefficient of linear thermal expansion from 40° C. to 400° C. between the ceiling base 30 and the ceramic base 20 is preferably less than or equal to $1.5 \times 10^{-6}$/K. With this configuration, since a difference in thermal expansion between the ceramic base 20 and the ceiling base 30 is small, thermal stress is less likely to occur in the top base 12. When the ceramic base 20 is an alumina base, the metal-ceramic composite material of the ceiling base 30 is preferably, for example, AlSiC or SiSiCTi. Since the absolute value of a difference in coefficient of linear thermal expansion between AlSiC or SiSiCTi that is a component of the ceiling base 30 and alumina that is a component of the ceramic base 20 is small, thermal stress is less likely to occur in the top base 12. Instead of using the ceiling base 30 as the RF electrode, the metal bonding layer 40 may be used as an RF electrode or the bottom base 80 may be used as an RF electrode.

In addition, since the bottom base 80 is made of an easy-to-work material, it is easy to form the flow channel groove 88 or the seal grooves 89, so a working cost is reduced. Since the seal grooves 89 are provided on the top surface of the bottom base 80, positioning of the seal members 16 is easy.

Furthermore, since the outer seal members 16a are doubly provided, the flow channel groove 88-side outer seal member 16a is protected from process gas or plasma by the outermost peripheral outer seal member 16a, corrosion resistance is increased. At this time, when the outermost peripheral outer seal member 16a is made of a material higher in corrosion resistance than the flow channel groove 88-side outer seal member 16a, corrosion resistance is further increased. For example, the outermost peripheral outer seal member 16a may be made of metal, and the flow channel groove 88-side outer seal member 16a may be made of resin.

Then, the top base 12 and the bottom base 80 are clamped by the clamp member 70. Since the seal members 16 are sufficiently squished from both top and bottom in mechanical bonding, such as clamping, it is possible to sufficiently exercise the seal function of the seal members 16. Examples of the mechanical bonding include bolt fastening and rivet fastening other than clamping.

The present invention is not limited to the above-described embodiment and may be, of course, implemented in various modes within the technical scope of the present invention.

For example, in the wafer placement table 10 of the above-described embodiment, a hole may be provided so as to extend through the wafer placement table 10 from the bottom surface of the bottom base 80 to the wafer placement surface 22a. Examples of such a hole include a gas supply hole for supplying heat transfer gas (for example, He gas) to the back surface of a wafer W and a lift pin hole for allowing insertion of a lift pin for lifting or lowering a wafer W with respect to the wafer placement surface 22a. Heat transfer gas is supplied to a space formed by the wafer W and a large number of small protrusions (which support a wafer W) (not shown) provided on the wafer placement surface 22a. The lift pin hole is provided at three locations when a wafer W is supported by, for example, three lift pins. When such through-holes are provided, a seal member 16 (inner seal member 16b) is also disposed around each of a gas supply hole and lift pin holes as in the case around each of the electrically insulating tubes 55, 65 in the space between the bottom surface of the top base 12 and the top surface of the bottom base 80.

In the wafer placement table 10 of the above-described first embodiment, the ceiling base 30 is made of an MMC. Alternatively, a ceiling base made of metal may be used instead. In this case, the ceiling base made of metal, as well as the ceiling base 30 made of metal-ceramic composite material, preferably has a high ductility and conductivity. In addition, the absolute value of a difference in coefficient of linear thermal expansion from 40° C. to 400° C. between the ceiling base made of metal and the ceramic base 20 is preferably less than or equal to $1.5 \times 10^{-6}$/K. The ceiling base made of metal may be, for example, a molybdenum base when the ceramic base 20 is an aluminum nitride base. The coefficient of linear thermal expansion from 40° C. to 400° C. is $4.6 \times 10^{-6}$/K for aluminum nitride, and $5.6 \times 10^{-6}$/K for molybdenum.

Figure 7:
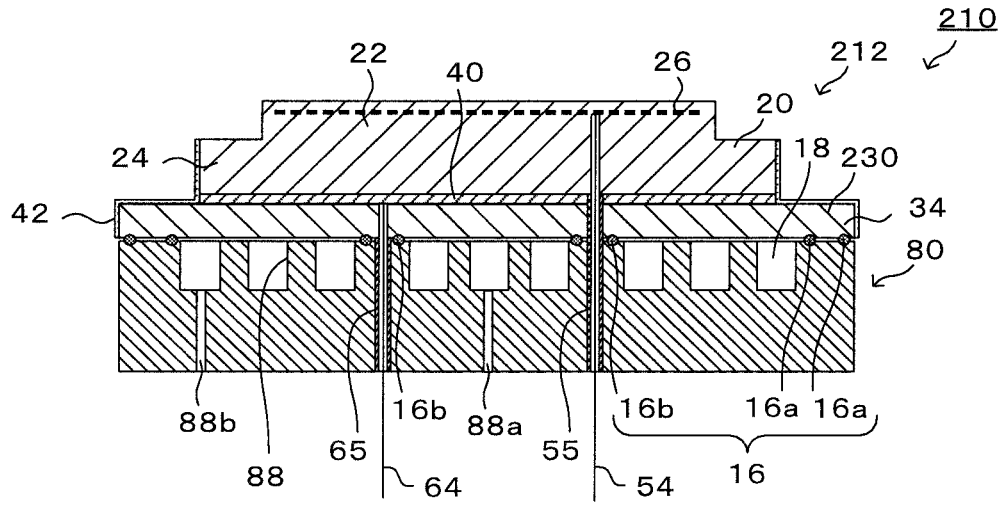
FIG. 7 is a longitudinal sectional view of a wafer placement table 210.

In the wafer placement table 10 of the above-described embodiment, the ceiling base 30 made of metal-ceramic composite material is used. Alternatively, as in the case of the wafer placement table 210 of FIG. 7, the ceiling base 230 made of a ceramic material of which the main component is the same as the main component of the ceramic base 20 may be used. FIG. 7 is a longitudinal sectional view of the wafer placement table 210 that includes the ceiling base 230. In FIG. 7, like reference signs are assigned to the same components as those of the above-described embodiment. In the wafer placement table 210, the top base 212 includes the ceramic base 20, the ceiling base 230 disposed on the lower side of the ceramic base 20 and defining the ceiling of the refrigerant flow channel 18, and the metal bonding layer 40 bonding the ceramic base 20 with the ceiling base 230. The ceiling base 230 is made of a ceramic material of which the main component is the same as the main component of the ceramic base 20. The main component is a component that occupies 50 percent by mass or higher of the entire component contained, preferably 70 percent by mass or higher, and more preferably 90 percent by mass or higher. Since the absolute value of a difference in coefficient of linear thermal expansion is small between ceramic materials with the same main component, in the top base 212 that includes the thus configured ceiling base 230, a difference in thermal expansion between the ceiling base 230 and the ceramic base 20 is small, and a warpage or breakage of the top base 212 due to thermal stress is less likely to occur. The ceiling base 230 may be made of a material lower in purity than the ceramic base 20. For example, an alumina with a high purity (for example, alumina 99% or higher) may be used for the ceramic base 20 from the viewpoint of improvement in electrical characteristics as a dielectric layer, and an alumina with a low purity (for example, alumina lower than 99%) may be used for the ceiling base 230 from the viewpoint of improvement in mechanical characteristics (ductility and strength) and cost reduction. The material lower in purity may contain a greater amount of glassy material, such as $SiO_2$, than the material higher in purity. Since the ceiling base 230 made of a ceramic material has no conductivity, the ceiling base 230 cannot be used as an RF electrode. Then, in the wafer placement table 210, an RF power supply may be connected to the metal bonding layer 40 via the power supply terminal 64, and the metal bonding layer 40 may be caused to function as an RF electrode. The power supply terminal 64 is provided so as to pass through the electrically insulating tube 65 and reach the metal bonding layer 40 from the bottom surface of the ceiling base 230. In the above-described wafer placement table 210, the ductility of the ceiling base 230 is lower than that of the ceiling base 30 made of metal-ceramic composite material, and the ceiling base 230 cannot be caused to function as an RF electrode; however, other than those, similar advantageous effects to those of the wafer placement table 10 are obtained. The wafer placement table 210 is advantageous in that it is easy to adjust the coefficient of thermal expansion between the ceramic base 20 and the ceiling base 230 and a funding cost is suppressed as compared to metal-ceramic composite material. In the wafer placement table 210, the ceiling base 230 is made of a ceramic material of which the main component is the same as the main component of the ceramic base 20. Alternatively, the ceiling base 230 may be made of a ceramic material of which the main component is different from the main component of the ceramic base 20. In this case as well, the absolute value of a difference in coefficient of linear thermal expansion from 40° C. to 400° C. between the ceiling base made of a ceramic material and the ceramic base 20 is preferably less than or equal to 1.5×10$^{-6}$/K. Instead of using the metal bonding layer 40 as an RF electrode, the bottom base 80 may be used as an RF electrode. The ceramic base 20 and the ceiling base 230 are bonded by the metal bonding layer 40. Alternatively, at the time of manufacturing the ceramic base 20 and the ceiling base 230, the metal bonding layer 40 may be omitted by integrally sintering both.

Figure 8:
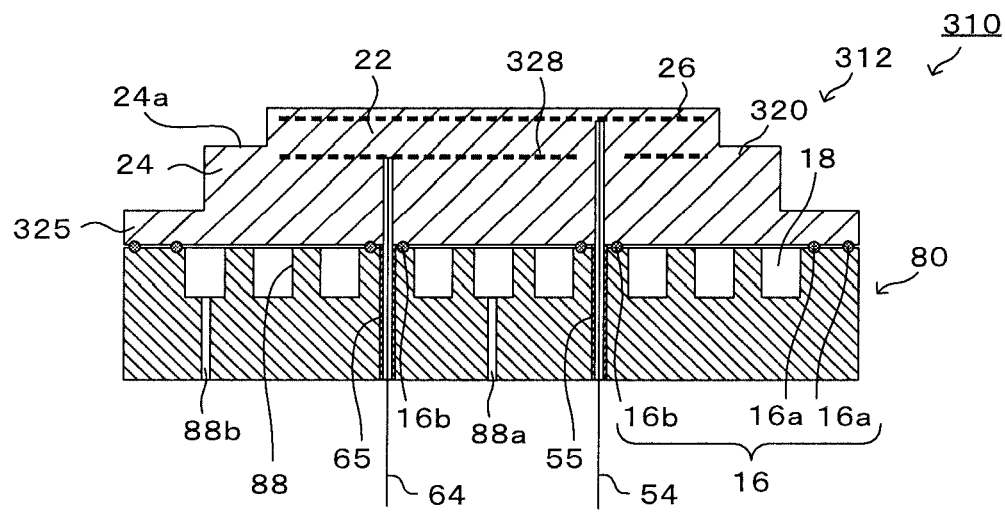
FIG. 8 is a longitudinal sectional view of a wafer placement table 310.

In the wafer placement table 10 of the above-described embodiment, the top base 12 includes the ceramic base 20, the ceiling base 30, and the metal bonding layer 40. Alternatively, as in the case of a wafer placement table 310 of FIG. 8, a top base 312 may be made up of a single layer of a ceramic base 320. FIG. 8 is a longitudinal sectional view of the wafer placement table 310 that includes the top base 312 made up of a single layer of the ceramic base 320. In FIG. 8, like reference signs are assigned to the same components as those of the above-described embodiment. In the wafer placement table 310, the top base 312 is made up of a single layer of the ceramic base 320. The material of the ceramic base 320 is similar to that of the ceramic base 20. The ceramic base 320 includes an outermost peripheral part 325 outside the outer peripheral part 24 having the focus ring placement surface 24a. The top surface of the outermost peripheral part 325 is lower in level than the focus ring placement surface 24a. The outside diameter of the outermost peripheral part 325 is the same as the outside diameter of the bottom base 80. The top base 312 is clamped to the mounting plate 96 together with the bottom base 80 at the outermost peripheral part 325. The central part 22 of the ceramic base 320 incorporates an RF electrode 328 between the wafer attraction electrode 26 and the bottom surface of the ceramic base 320. The RF electrode 328 is made of a material that contains, for example, W, Mo, WC, MoC, or the like. An RF power supply is connected to the RF electrode 328 via the power supply terminal 64. The power supply terminal 64 is provided so as to pass through the electrically insulating tube 65 disposed in a through-hole extending through the bottom base 80 in the up and down direction and reach the RF electrode 328 from the bottom surface of the ceramic base 320. In the above-described wafer placement table 310, such an advantageous effect of protecting the ceramic base 20 with the ceiling base 30 is not obtained, but, other than that, similar advantageous effects to those of the wafer placement table 10 are obtained. The wafer placement table 310 is advantageous in that the ceramic base 320 does not need to be bonded to another member (ceiling base 30 or the like) and TCB may be omitted. In the wafer placement table 310, the ceramic base 320 incorporates the RF electrode 328; however, the RF electrode 328 may be provided at the bottom surface. Alternatively, the bottom base 80 may be used as an RF electrode.

In the wafer placement table 10 of the above-described embodiment, the ceramic base 20 is smaller in outside diameter than the ceiling base 30 or the bottom base 80. Alternatively, the ceramic base 20 may have the same outside diameter as the ceiling base 30 and the bottom base 80. At this time, the ceramic base 20, as in the case of the ceramic base 320 of the wafer placement table 310 of FIG. 8, may have an outermost peripheral part lower in level with respect to the focus ring placement surface 24a outside the outer peripheral part 24. In this case, in a state where the inner peripheral step surface 70a of the clamp member 70 is provided at the outermost peripheral part of the ceramic base 320, the wafer placement table 10 and the mounting plate 96 are united. Thus, the top base 12 and the bottom base 80 of the wafer placement table 10 are clamped, the seal members 16 are squished in the up and down direction, and the refrigerant flow channel 18 is sealed from the outs. At this time, in the top base 12, the outer peripheral part 34 of the ceiling base 30 is reinforced by the outermost peripheral part of the ceramic base 20 and the rigidity of a clamped part is increased, so the seal members 16 are firmly squished by clamping in the up and down direction, with the result that further reliable sealing is achieved.

Figure 9:
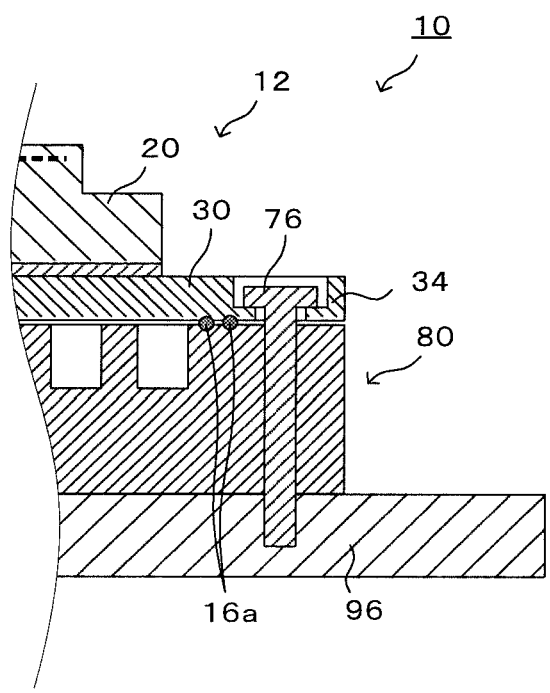
FIG. 9 is a view that illustrates an example in which the wafer placement table 10 is fastened to a mounting plate 96 by bolts 76.

In the above-described embodiment, the wafer placement table 10 is attached to the mounting plate 96 by using the clamp member 70. Alternatively, as shown in FIG. 9, the wafer placement table 10 may be attached to the mounting plate 96 by using bolts 76. Thus, the top base 12 and the bottom base 80 of the wafer placement table 10 are mechanically bonded. The bolts 76 are preferably disposed with a play between the outer peripheral surface of each bolt 76 and the inner peripheral surface of at least one of the top base 12 and the bottom base 80 so as to allow relative movement in a horizontal direction between the top base 12 and the bottom base 80. The top base 12 and the bottom base 80 may be mechanically bonded (clamping, bolt fastening, or the like), and attachment to the mounting plate 96 may be separately performed. Instead of bolt fastening from above, bolt fastening may be performed from below. In this case, the top base 12 and the bottom base 80 may be mechanically bonded not on the outer peripheral side but on the inner peripheral side.

In the above-described embodiment, the wafer attraction electrode 26 is incorporated in the central part 22 of the ceramic base 20. Instead of or in addition to this, an RF electrode for generating plasma may be incorporated. In this case, a radio-frequency power supply is connected to not the ceiling base 30 but the RF electrode. A focus ring (FR) attraction electrode may be incorporated in the outer peripheral part 24 of the ceramic base 20. In this case, a direct current power supply is connected to the FR attraction electrode. The ceramic base 20 may incorporate a heater electrode (resistance heating element). In this case, a heater power supply is connected to the heater electrode. In this way, the ceramic base 20 may incorporate one layer of electrode or may incorporate two or more layers of electrode. This also applies to the ceramic base 320.

In the above-described embodiment, the seal grooves 89 for mounting the seal members 16 are provided on the top surface of the bottom base 80; however, the seal grooves 89 may be omitted or seal grooves may be provided on the bottom surface of the top base 12.

In the above-described embodiment, the outer seal members 16a are double. Alternatively, the outer seal members 16a may be single or may be triple or more. The inner seal members 16b are single. Alternatively, the inner seal members 16b may be double or more. Instead of or in addition to the outer seal members 16a or the inner seal members 16b, a parallel running seal members provided so as to surround the flow channel groove 88 along the flow channel groove 88 may be disposed. When parallel running seal members are used, flow of refrigerant via a gap between the bottom surface of the top base 12 and the top surface of the bottom base 80 is suppressed. Even when no parallel running seal members are provided, flow of refrigerant via a gap between the bottom surface of the top base 12 and the top surface of the bottom base 80 is not so much, so there is almost no influence on soaking performance due to flow of refrigerant via the gap. Rather, manufacturing is easy without parallel running seal members.

In the above-described embodiment, the flow channel groove 88 is spirally provided from the inlet 88a to the outlet 88b; however, the planar shape of the flow channel groove 88 is not limited. A plurality of the flow channel grooves 88 may be provided.

In the above-described embodiment, the electrically insulating tube 65 may be omitted.

In the above-described embodiment, the ceramic sintered body 120 of FIG. 4A is made by firing a ceramic powder mold by hot pressing. The mold at that time may be made by laminating a plurality of tape molds, or may be made by mold casting, or may be made by compacting ceramic powder.

In the above-described embodiment, the bottom base 80 is made of an easy-to-work material; however, the bottom base 80 may be made of a composite material of metal and ceramics or may be made of a low thermal expansion metal, such as molybdenum. With this configuration, a difference in thermal expansion coefficient between the bottom base 80 and the top base 12 is small, so a warpage or breakage of the top base 12 and the bottom base 80 due to thermal stress is further reduced.

Figure 10:
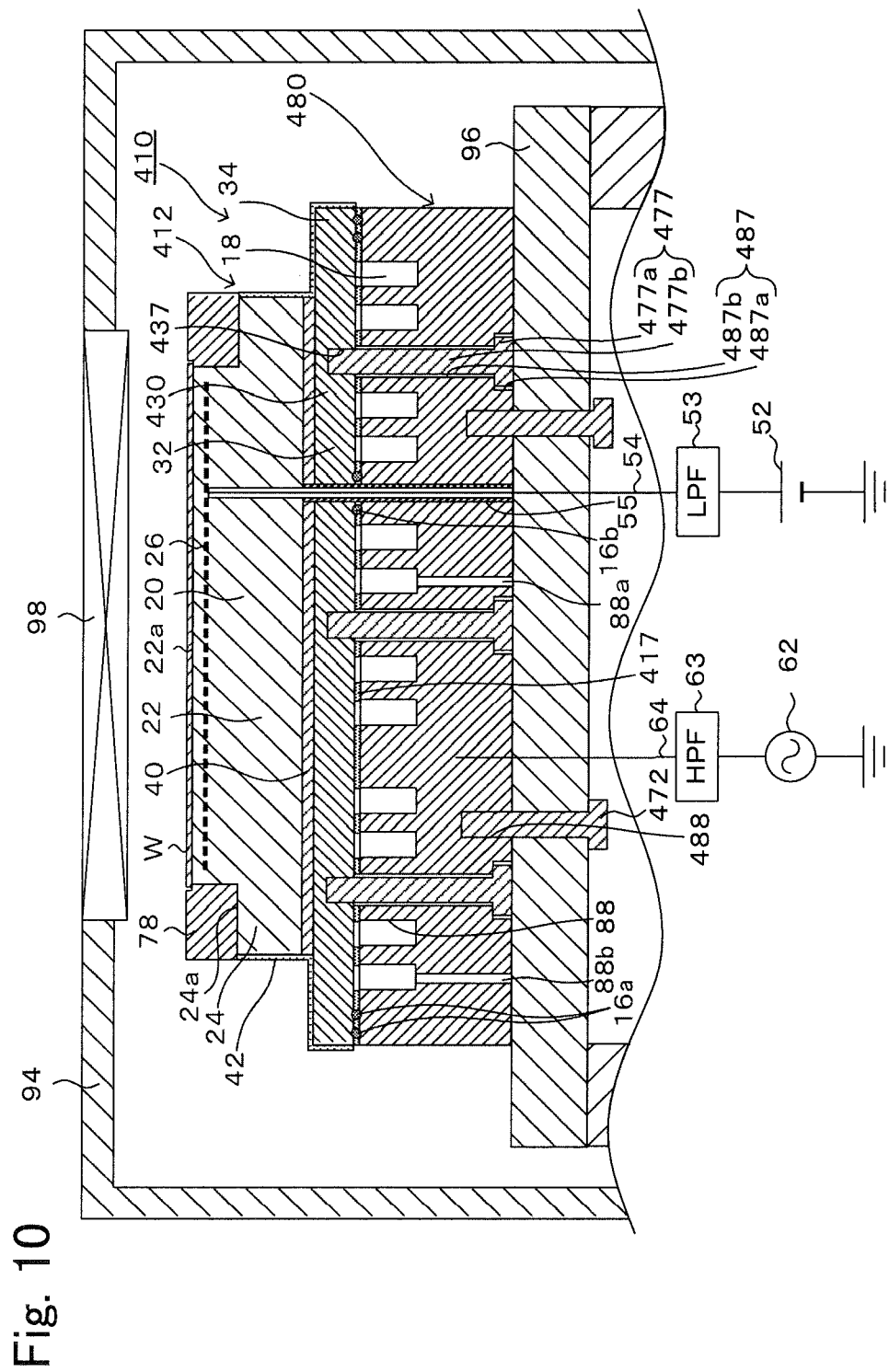
FIG. 10 is a longitudinal sectional view of a wafer placement table 410 placed in the chamber 94.
Figure 11:
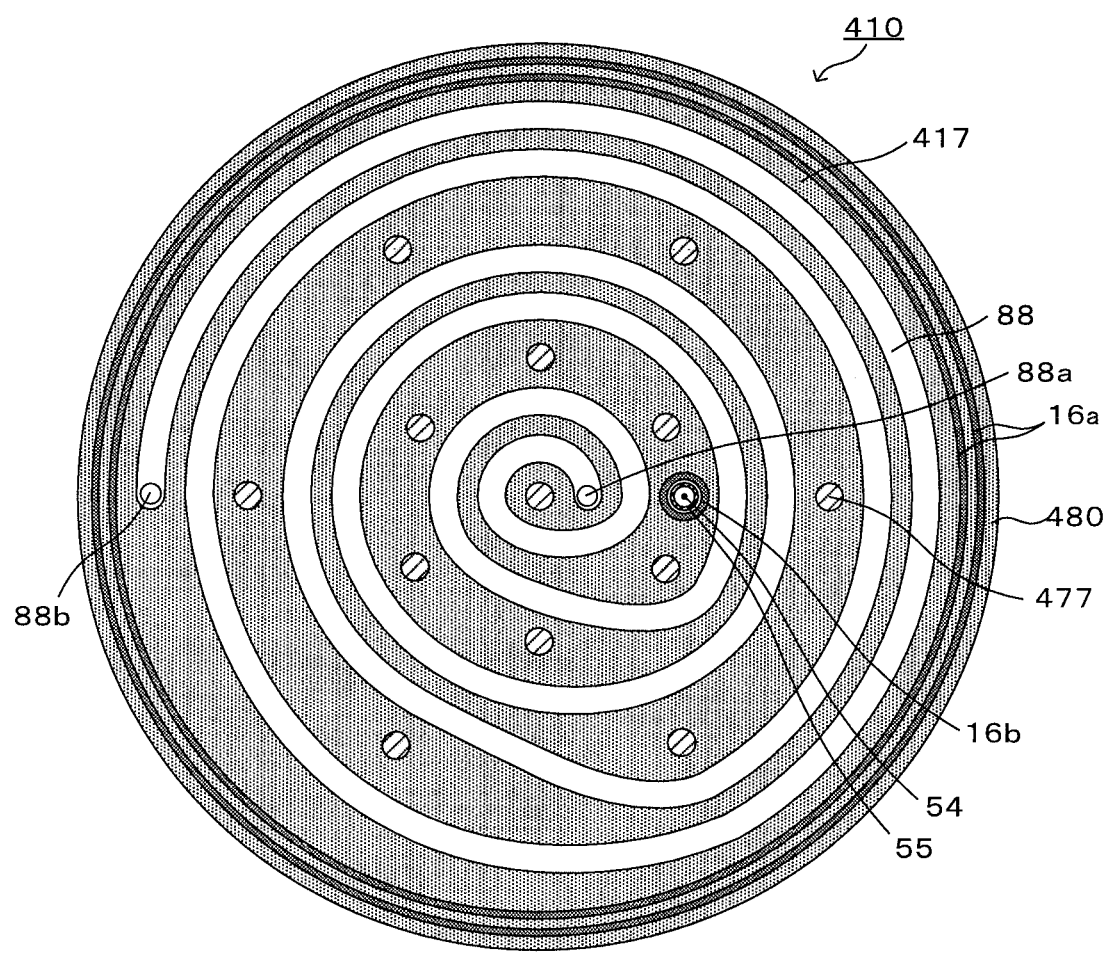
FIG. 11 is a sectional view of the wafer placement table 410, taken along a horizontal plane including a heatsink sheet 417, when viewed from above.

In the wafer placement table 10 of the above-described embodiment, it is assumed that there is a gap between the bottom surface of the top base 12 and the top surface of the bottom base 80. Alternatively, for example, as in the case of a wafer placement table 410 shown in FIG. 10 and FIG. 11, a heatsink sheet 417 may be disposed between the bottom surface of a top base 412 and the top surface of a bottom base 480. FIG. 10 is a longitudinal sectional view of the wafer placement table 410 that includes the heatsink sheet 417. FIG. 11 is a sectional view of the wafer placement table 410, taken along a horizontal plane including the heatsink sheet 417, when viewed from above. In FIG. 10 and FIG. 11, like reference signs are assigned to the same components as those of the above-described embodiment. In the wafer placement table 410, the top base 412 and the bottom base 480 are fastened by screw members 477 (for example, bolts). The wafer placement table 410 is fastened to the mounting plate 96 inside the chamber 94 by using screw members 472 (for example, bolts). Each of the screw members 472 is inserted from the bottom surface of the mounting plate 96 and is screwed to a threaded hole 488 that is open at the bottom surface of the bottom base 480. The power supply terminal 64 is connected to not the ceiling base 430 but the bottom base 480. Other than the wafer placement table 10, a configuration similar to that of the wafer placement table 410 may also be adopted in a wafer placement table 210 and a wafer placement table 310.

The top base 412 is configured similarly to the top base 12 except that the ceiling base 430 has a plurality of threaded holes 437 that are open at the bottom surface. The ceiling base 430 is configured similarly to the ceiling base 30 except that the ceiling base 430 has a plurality of threaded holes 437 that are open at the bottom surface. Here, of the threaded holes 437, one is provided at the center of the ceiling base 430, six are provided at equal intervals along the circumferential direction of the ceiling base 430 on the radially outer side of the center, and six are provided at equal intervals along the circumferential direction of the ceiling base 430 on the further radially outer side; however, the configuration is not limited. Here, each of the threaded holes 437 is formed by providing a cylindrical hole at the bottom surface of the ceiling base 430 and directly threading a threaded groove (not shown) in the cylindrical hole; however, the configuration is not limited thereto. For example, the threaded hole 437 may be formed by inserting a spiral screw insert in the cylindrical hole, or an internal thread terminal (for example, a cap nut or the like) may be inserted in the cylindrical hole to be brazed. The depth of the threaded hole 437 is not limited. The depth of the threaded hole 437 may be less than or equal to twice the nominal diameter of the screw member 477 or may be less than or equal to one and half times the nominal diameter of the screw member 477. With this configuration, it is possible to reduce the thickness of the top base 412 and the thickness of the ceiling base 430. The depth of the threaded hole 437 is preferably greater than or equal to the nominal diameter of the screw member 477 from the viewpoint of sufficiently generating the axial force of the screw member 477. A center-to-center distance between adjacent two of the threaded holes 437 is not limited and is preferably less than or equal to, for example, 100 mm. With this configuration, the ceiling base 430 and the bottom base 480 are tightly fastened by the screw members 477, and, by extension, the thermal conductivity of the heatsink sheet 417 improves. A center-to-center distance between adjacent two of the threaded holes 437 may be greater than or equal to, for example, 50 mm. The threaded holes 437 are preferably disposed on the bottom surface of the ceiling base 430 at a rate of $150/m^2$ or higher, and more preferably disposed at a rate of $200/m^2$ or higher. With this configuration, the ceiling base 430 and the bottom base 480 are further tightly fastened by the screw members 477, and, by extension, the thermal conductivity of the heatsink sheet 417 improves. It is applicable as long as the threaded holes 437 are open at the bottom surface of the ceiling base 430. The threaded holes 437 may be blind holes as shown in FIG. 10 or may be through-holes extending from the bottom surface of the ceiling base 430 to the top surface. In the wafer placement table 310 of FIG. 8, a top base 312 has no member that corresponds to the ceiling base 430; however, threaded holes similar to the threaded holes 437 may be provided on the bottom surface of a top base 312 made up of a ceramic base 320. In this case, threaded holes are preferably blind holes that do not reach the wafer attraction electrode 26.

The bottom base 480 is configured similarly to the bottom base 80 except that the bottom base 480 has a plurality of through-holes 487 and threaded holes 488 that are open at the bottom surface. The through-holes 487 are provided at locations facing the threaded holes 437 and extend through the bottom base 480 in the up and down direction. The through-holes 487 are stepped holes of which the lower side has a large diameter and the upper side has a small diameter. Each of the through-holes 487 has a large-diameter portion 487a that accommodates a head 477a of the screw member 477, and a small-diameter portion 487b that passes a leg 477b of the screw member 477 but does not pass the head 477a.

The heatsink sheet 417 is disposed between the bottom surface of the top base 412 and the top surface of the bottom base 480 in an area in which the flow channel groove 88 is not provided and the seal member 16 is also not provided. The heatsink sheet 417 is held between the top base 412 and the bottom base 480 and compressed in the up and down direction. With this configuration, the heatsink sheet 417 is firmly in close contact with the bottom surface of the top base 412 and the top surface of the bottom base 480, so heat of the top base 412 is quickly transferred to the bottom base 480. The thermal resistance of the heatsink sheet 417 is preferably lower than or equal to 0.5 K·cm²/W, more preferably lower than or equal to 0.35 K·cm²/W, and further preferably lower than or equal to 0.1 K·cm²/W. With this configuration, it is possible to further increase the efficiency of cooling a wafer W. The thermal conductivity of the heatsink sheet 417 is preferably higher than or equal to 2 W/(m·K), more preferably higher than or equal to 3 W/(m·K), and further preferably higher than or equal to 10 W/(m·K). With this configuration, it is possible to further increase the efficiency of cooling a wafer W. The thermal resistance and thermal conductivity of the heatsink sheet 417 are a thermal resistance and a thermal conductivity in the up and down direction in a state where the heatsink sheet 417 is assembled (that is, a state where the heatsink sheet 417 is compressed in the up and down direction at a predetermined pressure) and is able to be measured in compliant with ASTM-D5470. The Young's modulus of the heatsink sheet 417 is preferably lower than or equal to 100 MPa, more preferably lower than or equal to 20 MPa, and further preferably lower than or equal to 5 MPa. As the Young's modulus of the heatsink sheet 417 decreases, the fastening force of the screw members 477 is equally distributed over the entire surface of the heatsink sheet 417, so the heatsink sheet 417 is firmly in close contact with the top base 412 and the bottom base 480 over the entire surface. Therefore, it is possible to further uniformly cool a wafer W. The Poisson's ratio of the heatsink sheet 417 is preferably lower than or equal to 0.4, more preferably lower than or equal to 0.3, and further preferably lower than or equal to 0.2. As the Poisson's ratio of the heatsink sheet 417 decreases, the fastening force of the screw members 477 is equally distributed over the entire surface of the heatsink sheet 417 and does not escape laterally, so the heatsink sheet 417 is firmly in close contact with the top base 412 and the bottom base 480 over the entire surface. Therefore, it is possible to further uniformly cool a wafer W. The Shore hardness (ShoreOO) of the heatsink sheet 417 may be greater than or equal to 50 and less than or equal to 80. The thickness of the heatsink sheet 417 is, for example, preferably greater than or equal to 0.05 mm and less than or equal to 1 mm and more preferably greater than or equal to 0.1 mm and less than or equal to 0.3 mm.

Specifically, the heatsink sheet 417 is preferably a sheet containing carbon and resin. Examples of the carbon include graphite, carbon fiber, and carbon nanotube. Examples of the resin include silicone resin. In the case the carbon is graphite, it is preferably disposed such that the plane direction of graphene that constitutes graphite is aligned along the up and down direction. In the case the carbon is carbon fiber or carbon nanotube, it is preferably disposed such that the axial direction is aligned along up and down direction. The material of the heatsink sheet 417 may be, for example, a thermal interface material (TIM). Specific examples of the heatsink sheet 417 include EX20000C9 series and EX20000C4S series (both are produced by Dexerials Corporation) and Graphite PAD and Graphite TIM (registered trademark) (both are produced by Panasonic Corporation).

Each of the screw members 477 has the large-diameter head 477a and the small-diameter leg 477b. The screw member 477 is inserted into the through-hole 487 from the bottom surface of the bottom base 480 and screwed to the threaded hole 437 of the ceiling base 430. The head 477a of the screw member 477 is accommodated in the large-diameter portion 487a so as not to protrude downward from the bottom surface of the bottom base 480. By screwing each of the screw members 477 to an associated one of the threaded holes 437, the top base 412 and the bottom base 480 are fastened in a state where the heatsink sheet 417 and the seal member 16 are held between the top base 412 and the bottom base 480. Thus, the heatsink sheet 417 and the seal member 16 are compressed in the up and down direction. The material of each screw member 477 is preferably a material having a high electrical conductivity and a high thermal conductivity and is preferably, for example, stainless steel. The nominal diameter of each screw member 477 may be, for example, greater than or equal to 3 mm and less than or equal to 10 mm, may be greater than or equal to 4 mm and less than or equal to 8 mm, or may be greater than or equal to 6 mm and less than or equal to 8 mm.

With this wafer placement table 410, heat of the top base 412 is easily quickly transferred to the bottom base 480 by the heatsink sheet 417. Therefore, the efficiency of cooling a wafer W increases. The top base 412 and the bottom base 480 are fastened by the screw members 477. With this configuration, the heatsink sheet 417 is firmly in close contact with the top base 412 and the bottom base 480, so heat of the top base 412 is further quickly transferred to the bottom base 480. As a result, the efficiency of cooling a wafer further increases. When no heatsink sheet 417 is provided, refrigerant enters instead of the heatsink sheet 417, and refrigerant that has entered a gap between the top base 412 and the bottom base 480 is hard to flow and mostly stagnates in that place. For this reason, it is difficult to dissipate heat of the top base 412 to the bottom base 480 by using the gap. Therefore, as in the case of the wafer placement table 410, the low thermal resistance (high thermal conductivity) heatsink sheet 417 is preferably disposed in that gap.

The thermal resistance of the heatsink sheet 417 is preferably lower than or equal to 0.50 K·cm²/W. With this configuration, heat of the top base 412 is quickly transferred to the bottom base 480, so the efficiency of cooling a wafer W further increases. In achieving such a thermal resistance, a pressure for compressing the heatsink sheet 417 in the up and down direction is preferably set to, for example, higher than or equal to 0.05 MPa or higher than or equal to 0.2 MPa. With this configuration, the heatsink sheet 417 is firmly in close contact with the top base 412 and the bottom base 480, so the thermal resistance of the heatsink sheet 417 is reduced. A pressure for compressing the heatsink sheet 417 in the up and down direction is preferably, for example, lower than or equal to 0.6 MPa or lower than or equal to 0.55 MPa from the viewpoint of suppressing a breakage of the heatsink sheet 417.

Incidentally, a pressure for compressing the heatsink sheet 417 in the up and down direction tends to reduce as a distance from the screw member 477 extends, and the pressure varies in the in-plane direction. When a value obtained by dividing the variation of pressure [MPa] by a contact pressure [MPa] that acts on the heatsink sheet 417 on the assumption that the axial force of the screw member 477 equally acts on the heatsink sheet 417 is evaluated as pressure variations [-], the pressure variations are preferably lower than or equal to 2.0, more preferably lower than or equal to 1.7, and further preferably lower than or equal to 1.0. The pressure variations decrease as the Young's modulus of the heatsink sheet 417 decreases, and are able to be decreased as the center-to-center distance of the threaded holes 437 reduces. On the other hand, when the center-to-center distance of the threaded holes 437 is intended to be reduced to reduce pressure variations, a large number of the threaded holes 437 are needed, with the result that it may be difficult to dispose the threaded holes 437. According to simulation, when the Young's modulus of the heatsink sheet 417 is lower than or equal to 80 MPa, pressure variations are lower than or equal to 2.0 when the center-to-center distance of the threaded holes 437 is less than or equal to 70 mm, and pressure variations are lower than or equal to 1.0 when the center-to-center distance of the threaded holes is less than or equal to 55 mm. When the Young's modulus of the heatsink sheet 417 is lower than or equal to 10 MPa, pressure variations are substantially one even when the center-to-center distance of the threaded holes 437 is 100 mm. In this way, from the viewpoint of reducing pressure variations without excessively reducing the center-to-center distance of the threaded holes 437, the Young's modulus of the heatsink sheet 417 is preferably lower than or equal to 80 MPa and more preferably lower than or equal to 10 MPa. The number and arrangement of the threaded holes 437 are desirably set in consideration of pressure variations together with a pressure needed to compress the heatsink sheet 417 and the seal member 16 and a pressure needed to withstand the pressure of refrigerant flowing through the refrigerant flow channel 18.

The heatsink sheet 417 has an electrical conductivity. Thus, the bottom base 480 is at the same potential as the ceiling base 430 and the metal bonding layer 40, so, when the power supply terminal 64 is connected to the bottom base 480, the ceiling base 430 and the metal bonding layer 40 are able to be used as an RF electrode, and plasma is easily generated above a wafer W. Alternatively, the bottom base 480 and the ceiling base 430 may be set at the same potential via the screw members 477 by using the electrically conductive screw members 477.

Figure 12:
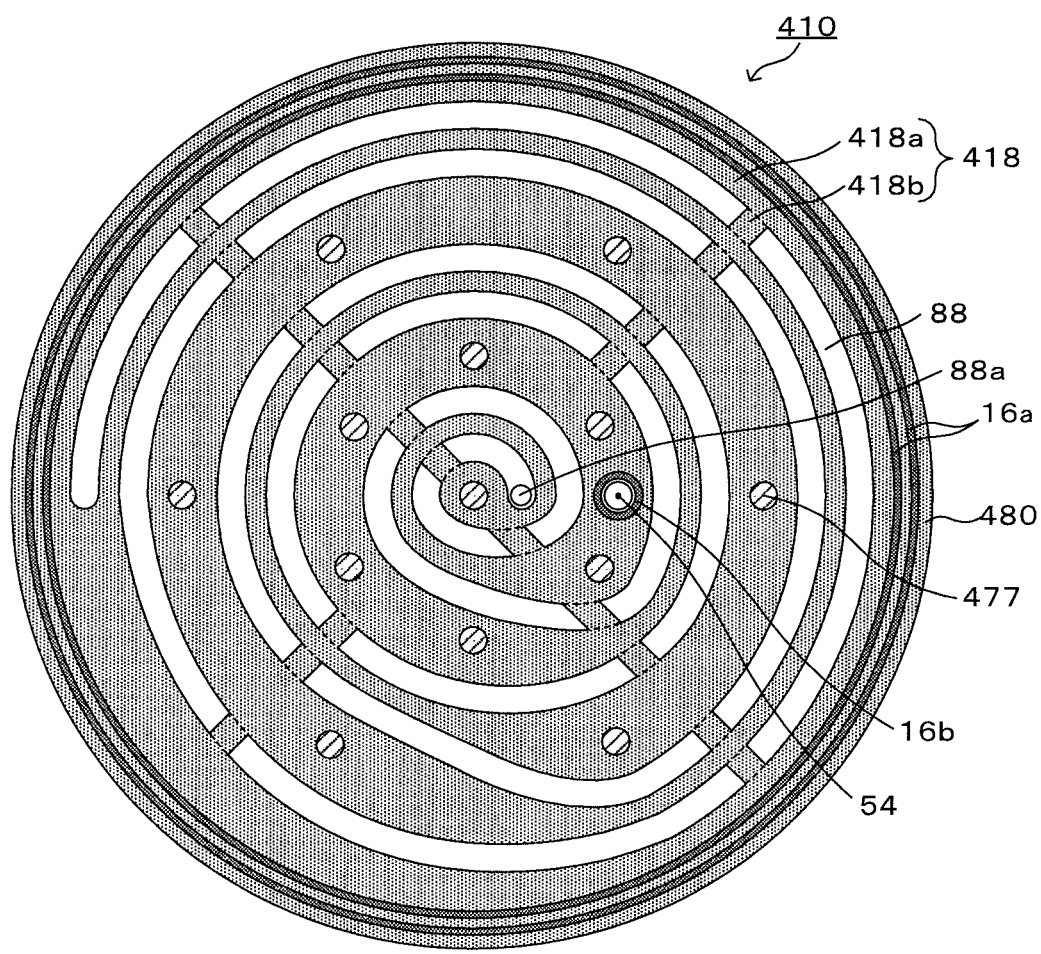
FIG. 12 is a sectional view showing an example in which the heatsink sheet 417 is changed in the sectional view of FIG. 11.

In the wafer placement table 410, instead of the heatsink sheet 417, a heatsink sheet 418 shown in FIG. 12 may be used. The heatsink sheet 418 includes a body part 418a having the same shape as the heatsink sheet 417, and a bridge part 418b bridged over the flow channel groove 88. With the body part 418a, it is possible to quickly transfer heat of the top base 412 to the bottom base 480. With the bridge part 418b, it is possible to hold the sheet shape of the heatsink sheet 418 and to increase the handling of the heatsink sheet 418. From the viewpoint of increasing the efficiency of cooling a wafer W, the coverage ratio of the heatsink sheet present on the flow channel groove 88 is preferably lower. For this reason, the area of the bridge part 418b is, for example, preferably less than or equal to ⅕ of the area of the flow channel groove 88 and more preferably less than or equal to ⅒ of the area of the flow channel groove 88.

In the above-described wafer placement table 410, the seal member 16 and the heatsink sheet 417 are combined. Alternatively, the heatsink sheet 417 may have the function of a seal member.

Figure 13:
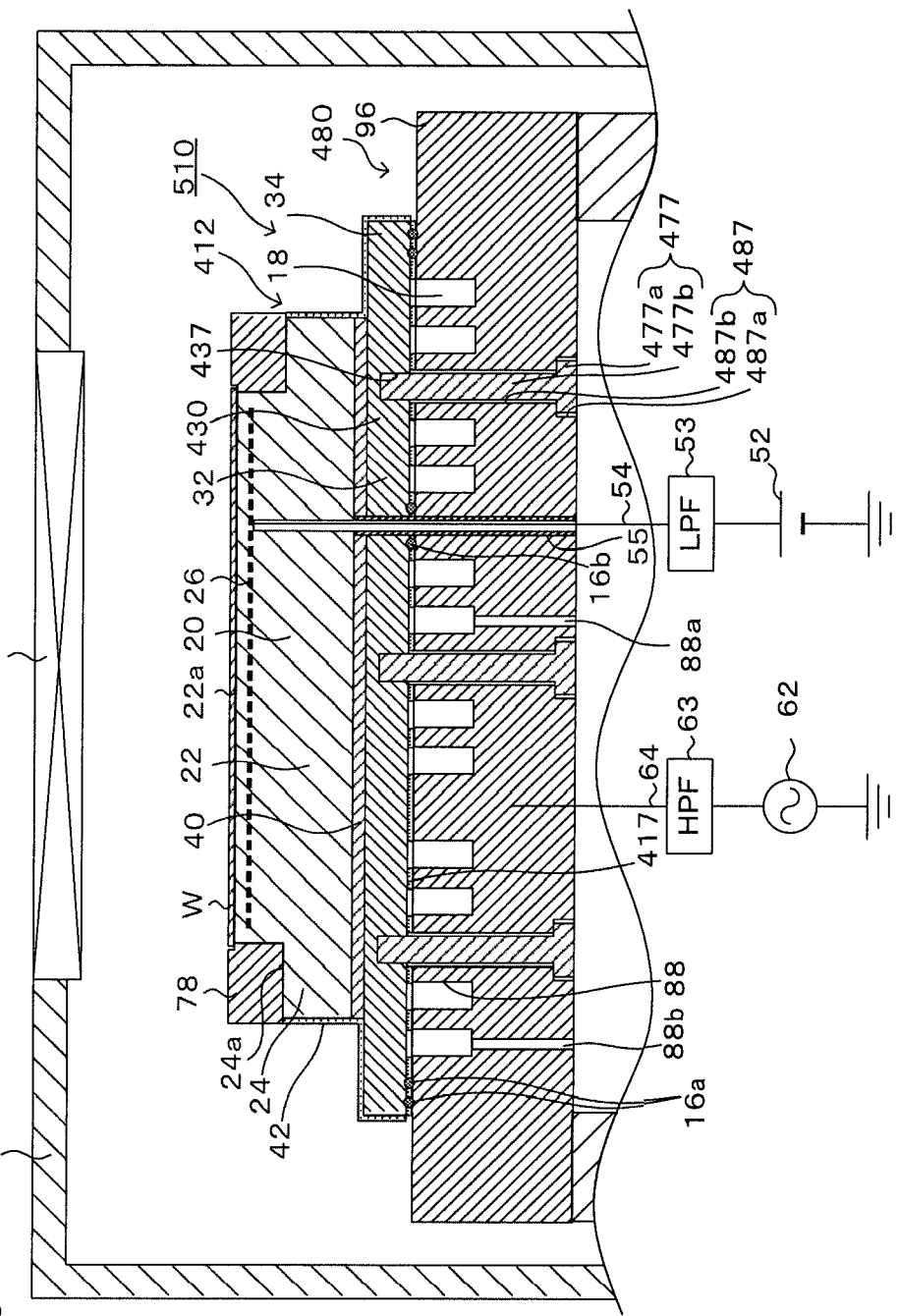
FIG. 13 is a longitudinal sectional view of a wafer placement table 510 placed in the chamber 94.

In FIG. 10, the wafer placement table 410 in which the top base 412 and the bottom base 480 are fastened by the screw members 477 is placed on the mounting plate 96 in the chamber 94; however, the configuration is not limited thereto. For example, as in the case of a wafer placement table 510 shown in FIG. 13, the bottom base 480 may also be used as the mounting plate 96 in the chamber 94. In FIG. 13, like reference signs are assigned to the same components as those of the above-described embodiment or the like.

The present application claims priority from Japanese Patent Application No. 2021-166020, filed on Oct. 8, 2021 and Japanese Patent Application No. 2022-103726, filed on Jun. 28, 2022, the entire contents of which are incorporated herein by reference.

What is claimed is:

1. A wafer placement table that includes a refrigerant flow channel through which refrigerant is flowed, the wafer placement table comprising:
  a top base that includes a ceramic base incorporating an electrode and having a wafer placement surface on a top surface of the ceramic base;
  a bottom base on a top surface of which a flow channel groove that defines a side wall and a bottom of the refrigerant flow channel is provided; and
  a seal member disposed between the top base and the bottom base so as to seal the refrigerant flow channel from an outside;
  wherein a bottom surface of the top base defines a ceiling of the refrigerant flow channel; and
  wherein the top base and the bottom base are not bonded at an interface between the ceiling of the refrigerant flow channel of the top base and the side wall and the bottom of the refrigerant flow channel of the bottom base.

2. The wafer placement table according to claim 1, wherein the top base includes the ceramic base, a ceiling base bonded to a bottom surface of the ceramic base and defining a ceiling of the refrigerant flow channel, and a metal bonding layer bonding the ceramic base with the ceiling base.

3. The wafer placement table according to claim 2, wherein an outside diameter of the ceiling base is greater than an outside diameter of the ceramic base.

4. The wafer placement table according to claim 2, wherein an outside diameter of the bottom base is the same as an outside diameter of the ceiling base.

5. The wafer placement table according to claim 2, wherein the absolute value of a difference in coefficient of linear thermal expansion from 40° C. to 400° C. between the ceiling base and the ceramic base is less than or equal to 1.5 x $10^{-6}$/K.

6. The wafer placement table according to claim 2, wherein the ceiling base is made of a composite material of metal and ceramics.

7. The wafer placement table according to claim 2, wherein the ceiling base is made of a ceramic material of which a main component is the same as a main component of the ceramic base.

8. The wafer placement table according to claim 1, wherein the top base is a single layer of the ceramic base.

9. The wafer placement table according to claim 1, wherein the bottom base is made of an easy-to-work material.

10. The wafer placement table according to claim 1, wherein multiple outer seal members provided so as to surround an outermost edge of the flow channel groove are provided as the seal member.

11. The wafer placement table according to claim 1, further comprising a heatsink sheet disposed between the bottom surface of the top base and the top surface of the bottom base.

12. The wafer placement table according to claim 11, wherein a thermal resistance of the heatsink sheet is lower than or equal to 0.5 K·cm²/W.

13. The wafer placement table according to claim 11, wherein a Young's modulus of the heatsink sheet is lower than or equal to 100 MPa.

14. The wafer placement table according to claim 11, wherein the heatsink sheet has a body part disposed on a part, where the flow channel groove is not provided, on the top surface of the bottom base, and a bridge part bridged over the flow channel groove.

\* \* \* \* \*